United States Patent
Gologhlan et al.

(10) Patent No.: US 6,458,212 B1
(45) Date of Patent: Oct. 1, 2002

(54) MESH FILTER DESIGN FOR LPCVD TEOS EXHAUST SYSTEM

(75) Inventors: Fuodoor Gologhlan, Campbell; David Chi, Sunnyvale; Kent Kuohua Chang, Cupertino; Hector Serrato, Ceres; Jayendra Bhakta, Sunnyvale, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/539,393

(22) Filed: Mar. 31, 2000

Related U.S. Application Data

(60) Provisional application No. 60/188,950, filed on Mar. 13, 2000.

(51) Int. Cl.⁷ .............................................. C23C 16/00
(52) U.S. Cl. .................. 118/715; 55/385.2; 55/463; 55/521; 55/487; 55/486; 55/525; 55/DIG. 30
(58) Field of Search .................. 118/715; 156/345; 55/385.2, 463, 521, 487, 486, 525, DIG. 30

(56) References Cited

U.S. PATENT DOCUMENTS

| | | | |
|---|---|---|---|
| 5,178,638 A | 1/1993 | Kaneko et al. | 29/25.01 |
| 5,250,092 A | 10/1993 | Nakano | 96/136 |
| 5,320,657 A * | 6/1994 | Adams | 55/463 |
| 5,484,575 A * | 1/1996 | Steenackers | 55/463 |
| 5,536,298 A * | 7/1996 | Awaji | 55/329 |
| 5,549,722 A * | 8/1996 | Zemaitis | 55/463 |
| 5,776,216 A | 7/1998 | Yang | 55/385.1 |
| 5,782,942 A | 7/1998 | Wu | 55/312 |
| 5,827,118 A | 10/1998 | Johnson et al. | 454/187 |
| 6,206,971 B1 * | 3/2001 | Umotoy | 118/715 |

* cited by examiner

Primary Examiner—Richard Bueker
(74) Attorney, Agent, or Firm—Amin & Turocy, LLP

(57) ABSTRACT

One aspect of the present invention relates to a tetraethylorthosilicate chemical vapor deposition method, involving the steps of forming a film on a substrate using tetraethylorthosilicate in a chemical vapor deposition chamber; and removing tetraethylorthosilicate byproducts from the chemical vapor deposition chamber via a pump system and an exhaust line connected to the chemical vapor deposition chamber, the exhaust line comprising a mesh filter having a conical shape. Another aspect of the present invention relates to an exhaust system for removing tetraethylorthosilicate byproducts from a chemical vapor deposition chamber, containing an exhaust line connected to the chemical vapor deposition chamber, the exhaust line comprising a mesh filter having a conical shape via a pump system; and a pump system connected to the exhaust line for removing tetraethylorthosilicate byproducts from the processing chamber.

18 Claims, 5 Drawing Sheets

MESH FILTER DESIGN FOR LPCVD TEOS EXHAUST SYSTEM

This application claims the benefit of provisional application 60/188,950 filed on Mar. 13, 2000.

TECHNICAL FIELD

The present invention generally relates to improved TEOS CVD processing. In particular, the present invention relates to reducing unwanted build-up in TEOS CVD exhaust systems thereby permitting temporary process stops substantially increasing the time intervals between servicing a CVD exhaust system.

BACKGROUND ART

Chemical vapor deposition (CVD) involves the formation of a solid film on a substrate by the reaction of vapor phase chemicals that contain the required constituents. The reactant gases are introduced into a reactant chamber and are decomposed and reacted at a heated surface to form the film. CVD techniques are widely employed in the fabrication of semiconductor structures; therefore, CVD techniques are some of the fundamental building blocks in semiconductor processing. Plasma enhanced chemical vapor deposition (PECVD) techniques involves using an rf-induced glow discharge to transfer energy into the reactant gases, thereby permitting the substrate to remain at relatively low temperatures (compared to other CVD techniques). Low pressure chemical vapor deposition (LPCVD) techniques involve, as the name implies, low pressures and are advantageous in that films having high purity, excellent uniformity, and conformal step coverage are obtainable. LPCVD techniques are disadvantageous in that high temperatures are typically required.

Another disadvantage associated with LPCVD processes involves the formation of tetraethylorthosilicate (TEOS) or $Si(OC_2H_5)_4$ films (or silicon dioxide layers made from TEOS starting material). During the LPCVD TEOS film formation process, the starting gas is continuously introduced into the reactor vessel, but a vacuum is continuously drawn from the reactor vessel through a vacuum extraction system typically containing an exhaust system connected to thereto, so that a predetermined low pressure is maintained in the reactor vessel to properly control the growth of the TEOS film. In many instances, the starting gas is not completely used in the formation of the TEOS film, and a large part thereof is undesirably pulled from the reactor vessel into the vacuum extraction/exhaust systems. As a result, the vacuum/exhaust systems that contribute to the low pressures, such as a mechanical booster pump, a rotary pump, a blower, various filters, and other related system elements, are damaged by the deposition therein of the starting gas pulled from the reactor vessel. In particular, the starting gas pulled from the reactor vessel is undesirably deposited on/in the filters thereby creating an unwanted build-up on/in filters of the exhaust system. TEOS byproducts also create an unwanted build-up on/in the exhaust system. TEOS material build-up is characterized by a very sticky film. This is problematic because the build-up on/in the filters of the exhaust systems requires frequent vigorous cleanings and/or replacement of the filters. If the clogged filters are not cleaned or replaced, a back stream is created wherein materials may undesirably flow back into the reactor vessel or processing chamber.

Conventionally, exhaust filters must be cleaned every five passes. One pass is defined as performing a CVD process on one set of wafers in a processing chamber. Such repetitive cleaning/replacement increases costs and/or constitutes "down time" in which the CVD process is not practiced.

The problem of unwanted build-up on/in the exhaust system of a TEOS LPCVD apparatus is better understood referring to FIG. 1, wherein a schematic representation of a prior art exhaust system 11 of a TEOS LPCVD apparatus 10 is shown. Specifically, TEOS LPCVD apparatus 10 includes a prior art exhaust system connected to a CVD process chamber 12. The exhaust system 11 includes exhaust line 14 housing a filter 18 and connected to a vacuum pump 16. FIG. 2 is a cross-sectional illustration of a prior art filter 18 for the exhaust system 11 of the TEOS LPCVD apparatus 10 of FIG. 1. The prior art filter 18 includes a cylindrical mesh filter element 20 and interior space 22. Gas flow, shown by arrows in both FIGS. 1 and 2, leaves the CVD process chamber 12 and travels through the cylindrical mesh filter element 20 of the prior art filter 18 and then to the vacuum pump 16. The unwanted build-up of TEOS byproducts on/in filter 18 of the exhaust system 11 is especially problematic at the bottom of the cylindrical mesh filter element 20 where the process stream first contacts the filter element 20.

Moreover, TEOS is particularly problematic in LPCVD processes because TEOS gas condenses in the vicinity of 35° C. Problems ensue when an LPCVD TEOS film formation process is temporarily stopped, such as during evening hours or during a power glitch. In particular, after the LPCVD apparatus is turned off, the apparatus cools down to room temperatures from its high operating temperatures. Since TEOS gas condenses around 35° C., TEOS materials build-up on various elements of the LPCVD apparatus including the exhaust system as the temperature of the LPCVD apparatus cools down. Upon turning the LPCVD apparatus back on, filter elements cannot function properly due to the solid build-up of TEOS material. In many instances, within only 30 minutes after stopping and LPCVD TEOS film formation process, TEOS material builds-up so extensively that it is impossible to return to the same LPCVD process conditions. Although it is sometimes desirable to temporarily interrupt the LPCVD TEOS film formation process in order to make minor process adjustments, such interruptions are avoided due to the possibility that the LPCVD apparatus cannot be turned back on.

Cleaning a filter in an LPCVD TEOS film formation process requires one to disconnect the filter from the LPCVD apparatus, disassemble the filter mechanism, clean the individual parts, reassemble the filter mechanism, connect the filter back to the LPCVD apparatus, and testing the cleaned system. Not only is this cleaning process cumbersome, but the LPCVD apparatus is rendered useless during the long cleaning time, thus inhibiting further semiconductor processing. It is desirable to have a properly functioning and long lasting filter element in the exhaust system of the TEOS LPCVD apparatus because the life and function of the gas lines and pump system are markedly improved.

SUMMARY OF THE INVENTION

The present invention provides an improved TEOS CVD process by providing an improved exhaust system for the TEOS CVD apparatus. The improved exhaust system contains a filter having a conical shape, thereby increasing the flow area of TEOS byproducts making filtering markedly more efficient. The improved exhaust system minimizes the need to clean and or replace the filter element and/or having to interrupt the CVD process to remove and insert a new and/or cleaned filter into the exhaust system. This is because TEOS material build-up in/on a CVD exhaust filer is minimized. Undesirable back streams of TEOS byproducts are minimized and/or eliminated by the present invention. The improved exhaust system enables operating the TEOS CVD apparatus at high pressures (such as those encountered in PECVD techniques) as well as low pressures (such as those encountered in LPCVD techniques). The present invention also provides methods for minimizing the accumulation of TEOS material in the pump/vacuum system of the CVD apparatus due to the improved exhaust system. As a result of the present invention, TEOS CVD processing capabilities are lengthened, temporary stops in TEOS CVD processing are facilitated, and cumbersome cleaning/replacement of the exhaust system filters of the CVD apparatus is minimized.

One aspect of the present invention relates to a tetraethylorthosilicate chemical vapor deposition method, involving the steps of forming a film on a substrate using tetraethylorthosilicate in a chemical vapor deposition chamber; and removing tetraethylorthosilicate byproducts from the chemical vapor deposition chamber via a pump system and an exhaust line connected to the chemical vapor deposition chamber, the exhaust line comprising a mesh filter having a conical shape.

Another of the present invention relates to a method of removing tetraethylorthosilicate byproducts from a chemical vapor deposition chamber, involving the steps of employing a pump system to draw a process stream comprising tetraethylorthosilicate byproducts from the chemical vapor deposition chamber through an exhaust line connected to the chemical vapor deposition chamber, the exhaust line comprising a mesh filter having a conical shape.

Yet another aspect of the present invention relates to a system for using tetraethylorthosilicate in a chemical vapor deposition apparatus, containing a processing chamber for using tetraethylorthosilicate to form a film on a substrate; an exhaust line connected to the chemical vapor deposition chamber, the exhaust line comprising a mesh filter having a conical shape via a pump system; and a pump system connected to the exhaust line for removing tetraethylorthosilicate byproducts from the processing chamber.

Still yet another aspect of the present invention relates to an exhaust system for removing tetraethylorthosilicate byproducts from a chemical vapor deposition chamber, containing an exhaust line connected to the chemical vapor deposition chamber, the exhaust line comprising a mesh filter having a conical shape via a pump system; and a pump system connected to the exhaust line for removing tetraethylorthosilicate byproducts from the processing chamber.

DISCLOSURE OF INVENTION

The present invention involves improving TEOS CVD processing by providing an exhaust filter having a conical shape. TEOS material build-up includes TEOS that is formed on the exhaust filter of the CVD apparatus, as well as TEOS starting materials and byproducts including particulate contaminants, silicon, alcohols, nitrogen, oxygen and the like. The starting materials when forming a TEOS layer typically include TEOS and inert gases. CVD TEOS processing also includes the formation of a silicon dioxide layer where TEOS is employed as a starting material therefor.

CVD apparatuses, atmospheric pressure chemical vapor deposition (APCVD) apparatuses, LPCVD apparatuses, and PECVD apparatuses are known in the art, and are commercially available. There is no limitation with regard to the type of CVD apparatus, LPCVD apparatus, and PECVD apparatus employed. CVD apparatuses typically include a processing chamber and an exhaust system, the exhaust system including an exhaust filter, exhaust line and a pump or vacuum system. The pump or vacuum system removes TEOS starting materials and byproducts from the processing chamber, through the exhaust filter and exhaust line of the exhaust system.

Figure 3:
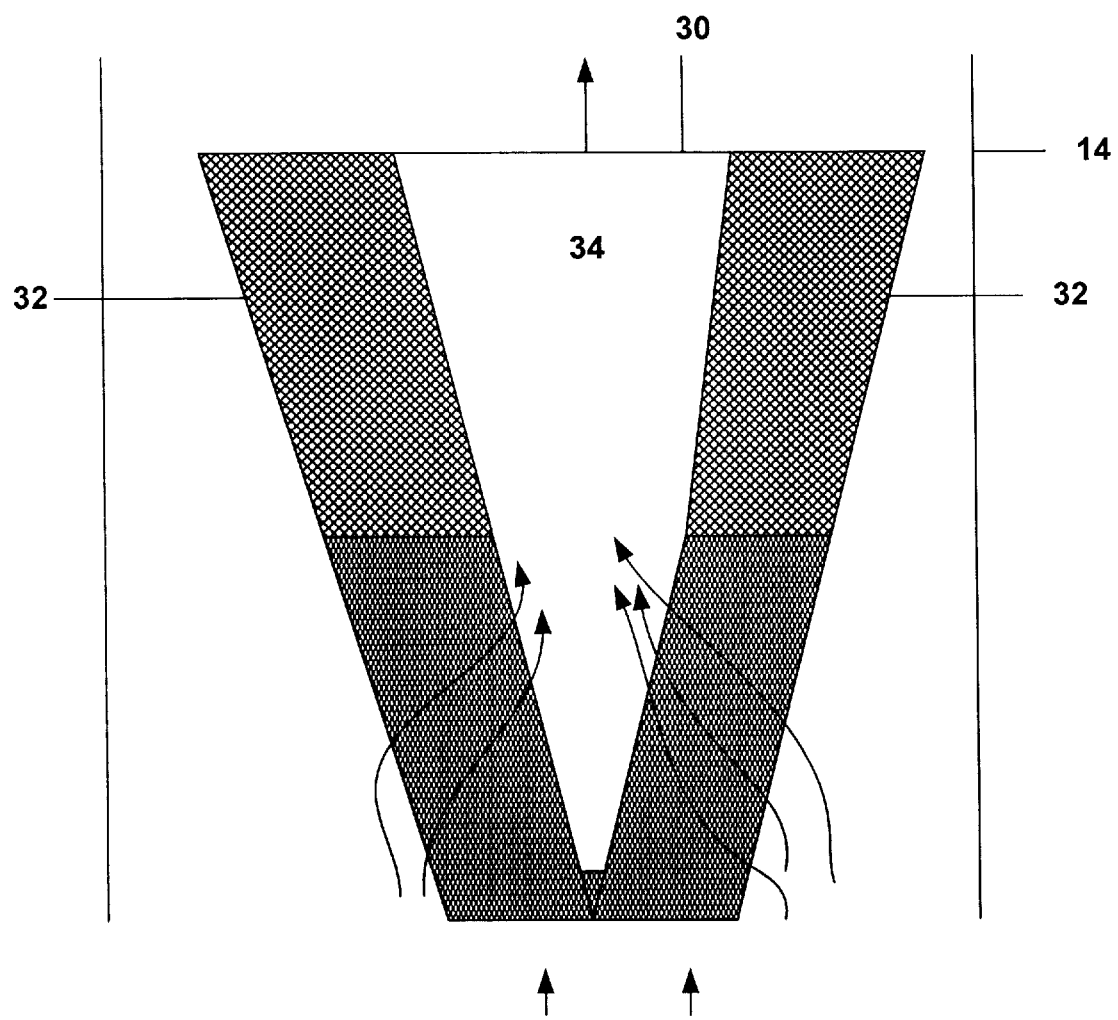
FIG. 3 is cross-sectional illustration of a filter for an exhaust system of a TEOS chemical vapor deposition apparatus in accordance with one aspect of the present invention.
Figure 4:
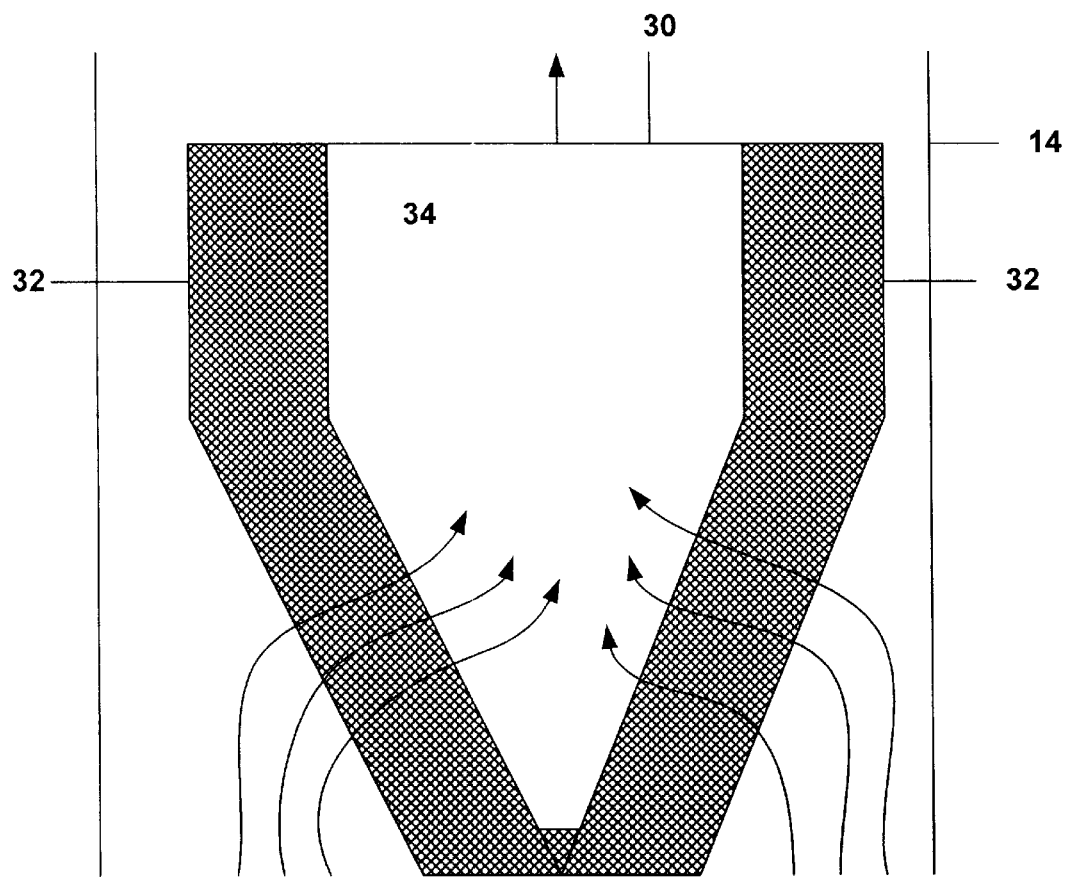
FIG. 4 is cross-sectional illustration of a filter for an exhaust system of a TEOS chemical vapor deposition apparatus in accordance with another aspect of the present invention.

The present invention involves any CVD apparatus that employs an exhaust filter. The filter has a conical shape. For example, a filter having a conical shape is shown in FIG. 3. Conical shapes include semi-conical shapes. For example, a filter having a conical shape in the form of a semi-conical shape is shown in FIG. 4. Conical shapes have a narrow or apex end and a wide or circular end. In FIGS. 3 and 4, the narrow or apex end is located at the bottom portion of the filter while the wide or circular end is located at the top of the filter.

The mesh material that makes up the exhaust filter having a conical shape is made of a material that does not substantially react with the gas stream. Metals including metal alloys, ceramics, plastics, and plastic coated metals are examples of mesh materials. For example, steel, stainless steel, carbon steel, Hastalloys, and copper, nickel, tantalum, titanium, zirconium and alloys thereof may be employed as mesh materials.

The mesh material (or the porous network) that makes up the exhaust filter may have a uniform thickness or non-uniform thickness. The mesh material that makes up the exhaust filter may have uniform density or non-uniform density. Uniform density in this context means having roughly the same size matrix openings throughout the filter. For example, referring to FIG. 4, an exhaust filter 30 is shown with a conical mesh filter element 32 having a uniform density. Non-uniform density in this context means that the mesh material has matrix openings of relatively small size (a first size) in certain regions while the mesh material has matrix openings of relatively large size (at least a second size) in other regions. For example, referring to FIG. 3, an exhaust filter 30 is shown with a conical mesh filter element 32 having a non-uniform density. The conical mesh filter element 32 having a non-uniform density is denser near the apex end or bottom portion where more TEOS starting materials and byproducts tend to pass through and less dense near the circular end or top portion where less TEOS starting materials and byproducts tend to pass through.

Figure 1:
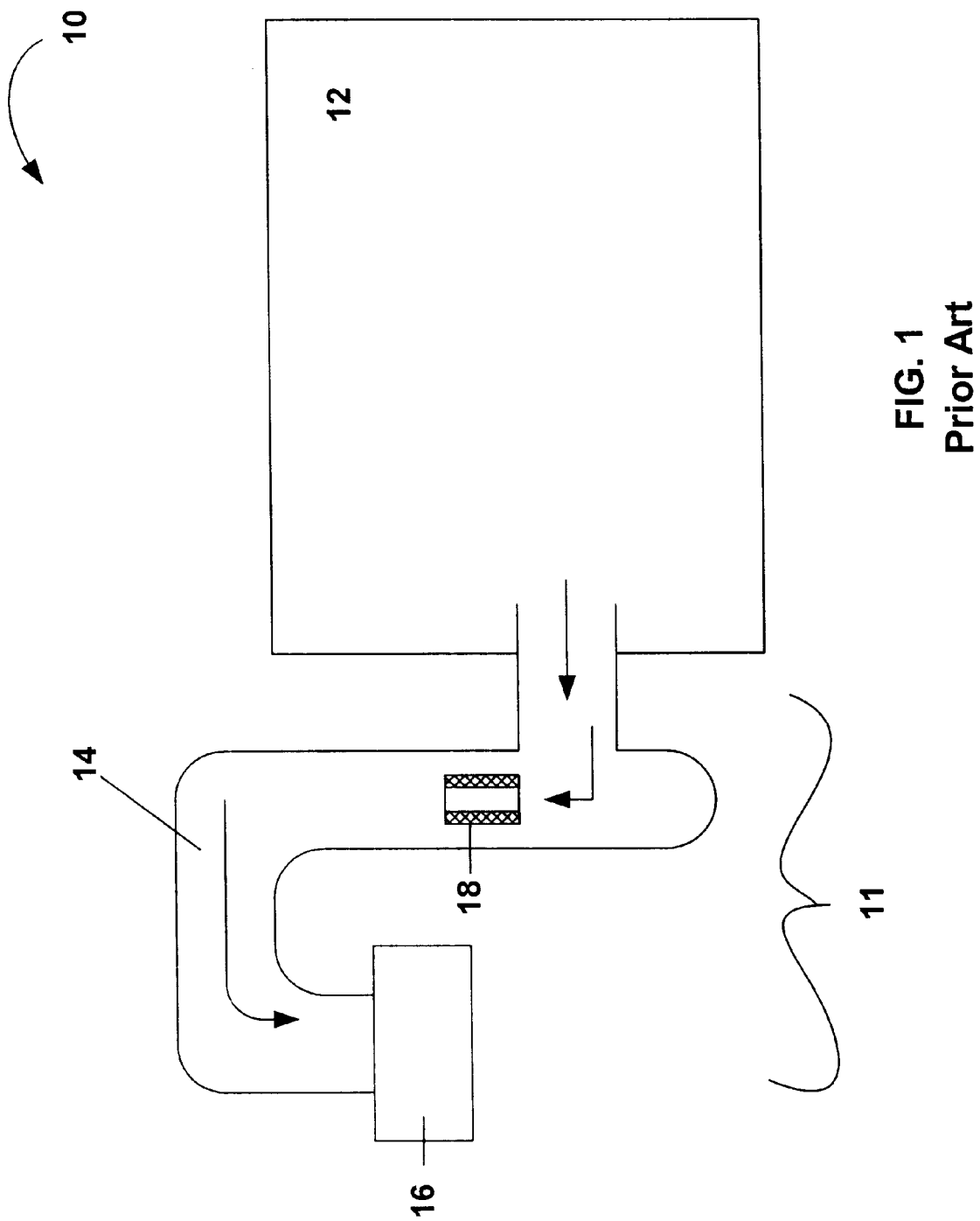
FIG. 1 is a schematic representation of a prior art exhaust system of a TEOS low pressure chemical vapor deposition apparatus.
Figure 2:
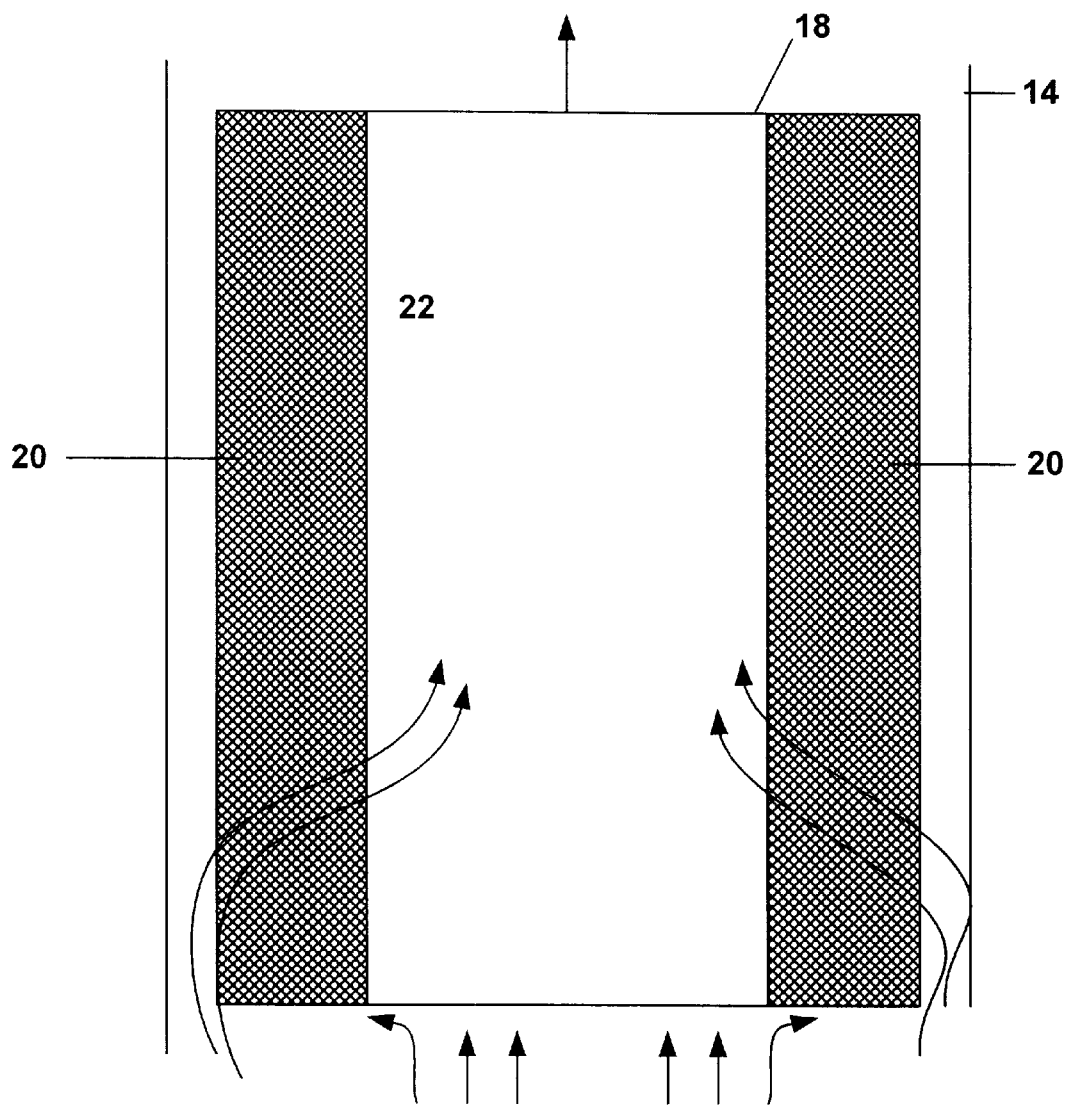
FIG. 2 is a cross-sectional illustration of a prior art filter for the exhaust system of the TEOS low pressure chemical vapor deposition apparatus of FIG. 1.

Conventional mesh filters have an entrance gap below 20%. The entrance gap, as used herein, refers to the % of the cross-sectional area of the exhaust line through which the gas stream passes (including TEOS and TEOS byproducts removed from the processing chamber) just prior to passing through the filter. The % entrance gap can be determined by subtracting the area of the cross-section of the filter end facing the gas stream (the apex end) from the area of the cross-section of the exhaust line to provide the entrance gap area, then dividing the entrance gap area by the area of the cross-section of the exhaust line and multiplying by 100. For example, referring to FIG. 2, where the exhaust line 14 is cylindrical and has a diameter of 4⅞", and the filter 18 has a diameter of 4½", the entrance gap is about 15%. Referring to FIG. 3, where the exhaust line 14 is cylindrical and has a diameter of 4⅞", and the exhaust filter 30 has a diameter of 1½" at the apex end, the entrance gap is about 90%.

The conical mesh filter of the present invention has an improved entrance gap which increases the TEOS byproducts flow area. In one embodiment, the conical mesh filter of the present invention has an entrance gap of at least about 25%, and particularly from about 25% to about 99%. In another embodiment, the conical mesh filter of the present invention has an entrance gap of at least about 30%, and particularly from about 30% to about 95%. In yet another embodiment, the conical mesh filter of the present invention has an entrance gap of at least about 40%, and particularly from about 40% to about 90%. In still yet another embodiment, the conical mesh filter of the present invention has an entrance gap of at least about 50%, and particularly from about 50% to about 85%.

Any pressure may be employed in the the CVD processing chamber of present invention, including low, ambient and high pressures. This is an advantage as TEOS layers (and silicon dioxide layers formed using TEOS) are frequently formed under low pressure conditions. Employing the conical mesh filter element of the present invention enables the application of ambient or high pressures during CVD processing in addition to low pressures. Low pressures are pressures below about 10 Torr. In another embodiment, low pressures are pressures below about 1 Torr. High pressures are pressures above ambient pressure, typically from about 1 to about 25 atmospheres.

In one embodiment, the pressure in the CVD apparatus is from about 0.01 Torr to about 20,000 Torr. In another embodiment, the pressure in the CVD apparatus is from about 0.05 Torr to about 1,000 Torr. In one embodiment, the CVD apparatus is an LPCVD apparatus and the pressure in the LPCVD apparatus is from about 0.01 Torr to about 100 Torr. In another embodiment, the CVD apparatus is an LPCVD apparatus and the pressure in the LPCVD apparatus is from about 0.1 Torr to about 10 Torr.

Any temperature that facilitates the formation of a CVD TEOS layer or a CVD silicon dioxide layer may be employed in the CVD processing chamber of the present invention. In one embodiment, the temperature in the CVD apparatus is from about 100° C. to about 1,000° C. In another embodiment, the temperature in the CVD apparatus is from about 200° C. to about 900° C. In one embodiment, the CVD apparatus is an LPCVD apparatus and the temperature in the LPCVD apparatus is from about 500° C. to about 800° C. In another embodiment, the CVD apparatus is an LPCVD apparatus and the temperature in the LPCVD apparatus is from about 600° C. to about 700° C.

The CVD apparatus is equipped with a pump/vacuum system that may establish and maintains a particular pressure within a reaction/deposition chamber and/or may induce an undesirable process stream out of the reaction/deposition chamber, where a substance is formed on a substrate (such as a TEOS layer over a wafer substrate). The pump system removes TEOS byproducts from the reaction/deposition chamber via an exhaust line. The exhaust line may be directly or indirectly connected to the reaction/deposition chamber. Pump systems and vacuum systems and the like for CVD apparatuses are known in the art, and are commercially available. There is no limitation with regard to the type of pump/vacuum system employed.

Comparing a TEOS CVD system employing a cylindrically shaped exhaust filter and a TEOS CVD system employing a conically shaped exhaust filter, the TEOS CVD system employing a cylindrically shaped exhaust filter requires changing the filter at least every fifth pass (every fifth set of wafers introduced into the system) whereas the TEOS CVD system employing a conically shaped exhaust filter requires changing the filter at least about every fifteenth pass. In another embodiment, the the TEOS CVD system employing a conically shaped exhaust filter requires changing the filter at least about every 20 passes. In yet another embodiment, the the TEOS CVD system employing a conically shaped exhaust filter requires changing the filter at least about every 25 passes. Disconnection and disassembly of the filter for cleaning or replacement is therefore markedly reduced when employing the present invention.

Figure 5:
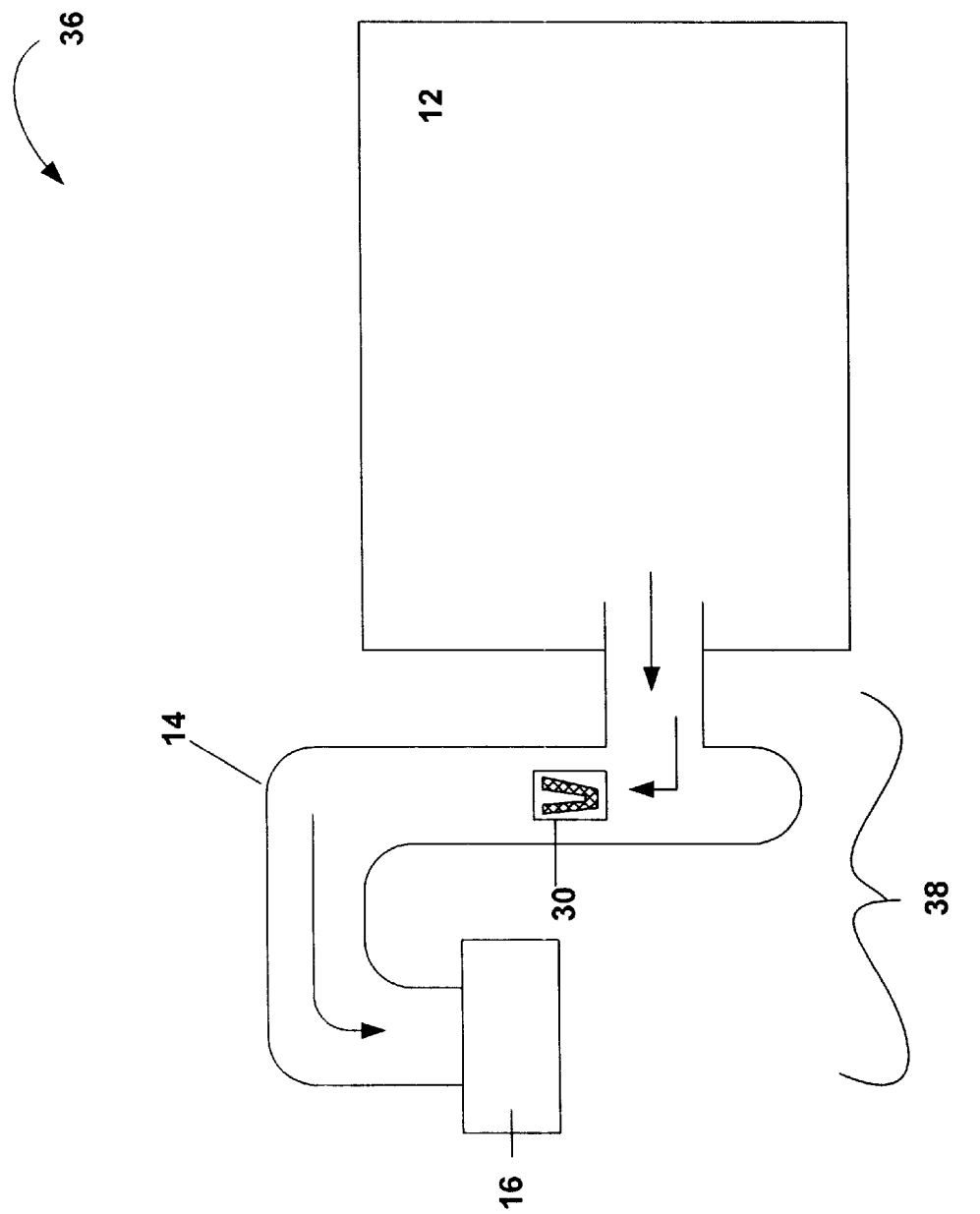
FIG. 5 is schematic representation of an exhaust system of a TEOS chemical vapor deposition apparatus in accordance with the present invention.

FIGS. 3 to 5 are schematic representations of filters and systems for chemical vapor deposition using TEOS. FIG. 5 specifically shows an CVD system 36 that contains at least an exhaust system 38 connected to a CVD process chamber 12. The exhaust system 38 includes exhaust line 14 housing a conical exhaust filter 30 and connected to a pump system 16, such as a vacuum pump. FIGS. 3 and 4 are cross-sectional illustrations of a conical exhaust filter 30 for the exhaust system 38 of the TEOS CVD system 36 of FIG. 5. The filter 30 includes a conical mesh filter element 32 and interior space 34. Gas flow, shown by arrows in FIGS. 3, 4, and 5, leaves the CVD process chamber 12 and travels through the conical mesh filter element 32 of the filter 30 and then towards the pump system 16.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A system for using tetraethylorthosilicate in a low pressure chemical vapor deposition apparatus, comprising:

a processing chamber for using tetraethylorthosilicate to form a film on a substrate;

an exhaust line connected to the low pressure chemical vapor deposition chamber, the exhaust line comprising a mesh filter having a conical shape via a pump system, wherein the mesh filter having the conical shape has an apex end facing the low pressure chemical vapor deposition chamber and a circular end opposite the apex end, and the mesh filter is denser at the apex end compared to the circular end; and a pump system comprising a vacuum pump, the pump system connected to the exhaust line for removing tetraethylorthosilicate byproducts from the processing chamber.

2. The system of claim 1 wherein the vacuum pump maintains a low pressure below about 10 Torr.

3. The system of claim 1, wherein the mesh filter having the conical shape has an entrance gap of at least about 40%.

4. The system of claim 1, wherein the mesh filter having a conical shape requires changing after at least about 20 passes.

5. The system of claim 1, wherein the mesh filter having a conical shape comprises stainless steel.

6. A tetraethylorthosilicate low pressure chemical vapor deposition method using the system of claim 1, comprising:

forming a film on a substrate using tetraethylorthosilicate in the processing chamber; and removing tetraethylorthosilicate byproducts from the processing chamber via the pump system and the exhaust line.

7. The method of claim 6, wherein the mesh filter having the conical shape has an entrance gap of at least about 25%.

8. The method of claim 6, wherein the film formed on the substrate is a tetraethylorthosilicate film or a silicon dioxide film.

9. The method of claim 6, wherein the film is formed on the substrate under a pressure from about 0.01 Torr to about 100 Torr at a temperature from about 500° C. to 800° C.

10. An exhaust system for removing tetraethylorthosilicate byproducts from a low pressure chemical vapor deposition chamber, comprising:

an exhaust line connected to the low pressure chemical vapor deposition chamber, the exhaust line comprising a mesh filter having a conical shape via a pump system, wherein the mesh filter having to conical shape has an apex end facing the low pressure chemical vapor deposition chamber and a circular end opposite the apex end, and the mesh filter is denser at the apex end compared to the circular end; and a pump system comprising a vacuum pump, the pump system connected to the exhaust line for removing tetraethylorthosilicate byproducts from the processing chamber.

11. The system of claim 10, wherein vacuum pump maintains a low pressure below about 10 Torr.

12. The system of claim 10, wherein the mesh filter having the conical shape has an entrance gap of at least about 50%.

13. The system of claim 10, wherein the mesh filter having a conical shape requires changing after at least about 25 passes.

14. The system of claim 10, wherein the mesh filter having a conical shape comprises a metal or a metal alloy.

15. The system of claim 10, wherein the mesh filter having the conical shape has an entrance gap from about 30% to about 95%.

16. A method of removing tetraethylorthosilicate byproducts from a low pressure chemical vapor deposition chamber using the exhaust system of claim 10 comprising:

employing the pump system to draw a process stream comprising tetraethylorthosilicate byproducts from the low pressure chemical vapor deposition chamber through the exhaust line.

17. The method of claim 10, wherein the mesh filter having the conical shape has an entrance gap of at least about 40%.

18. The method of claim 10, wherein the mesh filter having a conical shape comprises stainless steel.

* * * * *